US010672621B2

(12) United States Patent
Sasao et al.

(10) Patent No.: US 10,672,621 B2
(45) Date of Patent: Jun. 2, 2020

(54) PATTERN FORMING MATERIAL, PATTERN FORMING METHOD, AND METHOD FOR MANUFACTURING SEMICONDUCTOR DEVICE

(71) Applicant: TOSHIBA MEMORY CORPORATION, Tokyo (JP)

(72) Inventors: Norikatsu Sasao, Kanagawa (JP); Koji Asakawa, Kanagawa (JP); Tomoaki Sawabe, Tokyo (JP); Shinobu Sugimura, Kanagawa (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

(21) Appl. No.: 16/299,548

(22) Filed: Mar. 12, 2019

(65) Prior Publication Data
US 2020/0006076 A1    Jan. 2, 2020

(30) Foreign Application Priority Data

Jun. 27, 2018   (JP) ................................. 2018-121618

(51) Int. Cl.
*H01L 21/308*    (2006.01)
*C08K 3/16*    (2006.01)
(Continued)

(52) U.S. Cl.
CPC ........ *H01L 21/3081* (2013.01); *C08F 212/08* (2013.01); *C08F 220/18* (2013.01);
(Continued)

(58) Field of Classification Search
CPC ................. H01L 21/3081; H01L 21/3086
(Continued)

(56) References Cited

U.S. PATENT DOCUMENTS 6,906,116 B2   6/2005   Nishikubo et al.
9,690,185 B2   6/2017   Yaegashi
(Continued)

FOREIGN PATENT DOCUMENTS

JP   4121658 B2   7/2008
JP   5050683 B2   10/2012
(Continued)

OTHER PUBLICATIONS

Biswas, M., et al., "New Insight into the Mechanism of Sequential Infiltration Synthesis from Infrared Spectroscopy", Chemistry of Materials, vol. 26, pp. 6135-6141 (2014).

*Primary Examiner* — Roberts P Culbert
(74) *Attorney, Agent, or Firm* — Finnegan, Henderson, Farabow, Garrett & Dunner, L.L.P.

(57) ABSTRACT

The pattern forming material of an embodiment is a pattern forming material containing a polymer composed of two or more kinds of monomer units, in which a first monomer unit in the monomer units is provided with an ester skeleton having a first carbonyl group and one or more second carbonyl groups which bind to the ester skeleton, among the second carbonyl groups, the second carbonyl group that is farthest from a main chain of the polymer constituting the pattern forming material is present on a linear chain, and a second monomer unit in the monomer units is provided with a crosslinkable functional group on a side chain terminal.

20 Claims, 13 Drawing Sheets

(51) Int. Cl.
  *C08K 5/56* (2006.01)
  *C08F 220/18* (2006.01)
  *C08F 220/28* (2006.01)
  *C08F 212/08* (2006.01)

(52) U.S. Cl.
  CPC .............. *C08F 220/28* (2013.01); *C08K 3/16* (2013.01); *C08K 5/56* (2013.01); *H01L 21/3086* (2013.01); *C08F 2220/1808* (2013.01); *C08F 2220/283* (2013.01)

(58) Field of Classification Search
  USPC .......................................................... 216/41
  See application file for complete search history.

(56) References Cited

U.S. PATENT DOCUMENTS

| 2015/0322027 A1 | 11/2015 | Fujiwara et al. |
| 2018/0122648 A1* | 5/2018 | Kim .................. H01L 21/3086 |
| 2019/0218321 A1 | 7/2019 | Yamamoto et al. |

FOREIGN PATENT DOCUMENTS

| JP | 5384149 B2 | 1/2014 |
| JP | 2015-227326 A | 12/2015 |
| JP | 2019-124847 A | 7/2019 |

* cited by examiner

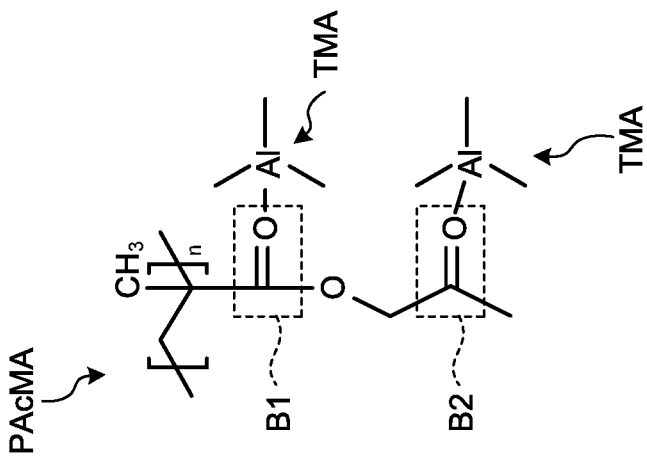
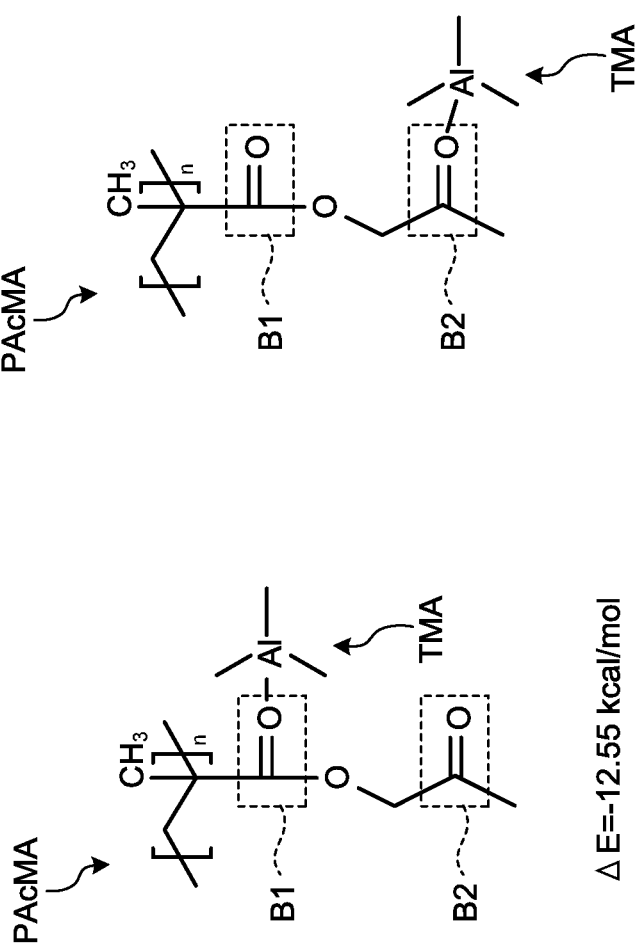

ΔE=-30.84 kcal/mol

ΔE=-43.81 kcal/mol

| | | | |
|---|---|---|---|
| | ![structure with ketone chain B3 O] | ![cyclohexanone structure] | ![lactone structure] |
| B1 | ΔE (kcal/mol) | -12.79 | -11.86 | -9.81 |
| B2 | ΔE (kcal/mol) | -19.43 | -15.88 | -15.01 |
| B3 | ΔE (kcal/mol) | -19.56 | -17.90 | -17.80 |

FIG.9
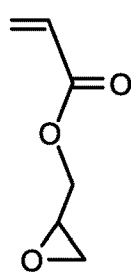
GLYCIDYL ACRYLATE
(GAA)
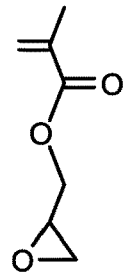
GLYCIDYL METHACRYLATE
(GMA)
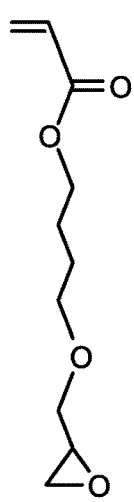
4-HYDROXYBUTYL
ACRYLATE GLYCIDYL
ETHER
(4HBAGE)
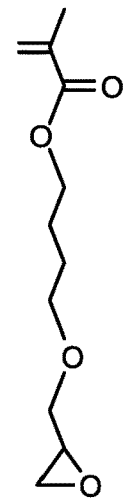
4-HYDROXYBUTYL
METHACRYLATE GLYCIDYL
ETHER
(4HBMGE)
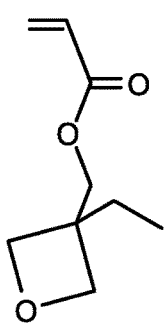
3-ETHYL-
3-OXETANYLMETHYL
ACRYLATE
(3E3OMAA)
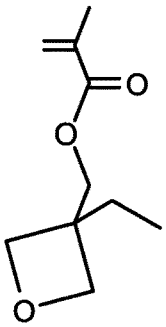
3-ETHYL-
3-OXETANYLMETHYL
METHACRYLATE
(3E3OMMA)

US 10,672,621 B2

PATTERN FORMING MATERIAL, PATTERN FORMING METHOD, AND METHOD FOR MANUFACTURING SEMICONDUCTOR DEVICE

CROSS-REFERENCE TO RELATED APPLICATIONS

This application is based upon and claims the benefit of priority from Japanese Patent Application No. 2018-121618, filed on Jun. 27, 2018; the entire contents of which are incorporated herein by reference.

FIELD

Embodiments described herein relate generally to a pattern forming material, a pattern forming method, and a method for manufacturing a semiconductor device.

BACKGROUND

In a process of manufacturing a semiconductor device, there is an increasing demand for having a technique of forming a pattern with high aspect ratio. Because the mask pattern used for this process is exposed to etching gas for a long period of time, high resistance to etching is required. To achieve a processed profile with high aspect ratio, there is also a case in which a stacked mask structure is employed for the mask pattern.

BRIEF DESCRIPTION OF THE DRAWINGS

FIG. 2A is a diagram illustrating the stabilization energy ΔE when a precursor is brought close to the polymer which contains two carbonyl groups in a side chain;

FIG. 2B is a diagram illustrating the stabilization energy ΔE when a precursor is brought close to the polymer which contains two carbonyl groups in a side chain;

FIG. 2C is a diagram illustrating the stabilization energy ΔE when a precursor is brought close to the polymer which contains two carbonyl groups in a side chain;

FIG. 9 is a chemical formula illustrating an example of a monomer which constitutes a second monomer unit according to an embodiment;

DETAILED DESCRIPTION

Figure 1C:
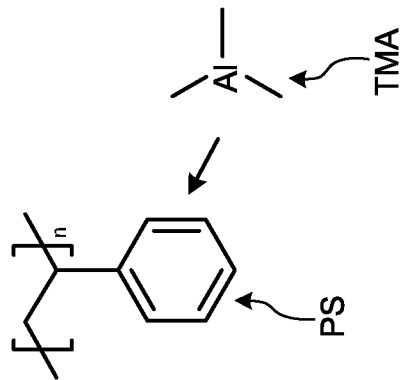
FIG. 1C is a diagram illustrating the stabilization energy ΔE when a precursor is brought close to the polymer.

The pattern forming material of the embodiments is a pattern forming material containing a polymer composed of two or more kinds of monomer units, in which a first monomer unit in the monomer units is provided with an ester skeleton having a first carbonyl group and one or more second carbonyl groups which bind to the ester skeleton, and, among the second carbonyl groups, the second carbonyl group that is farthest from a main chain of the polymer constituting the pattern forming material is present on a linear chain, and a second monomer unit in the monomer units is provided with a crosslinkable functional group on a side chain terminal.

Hereinbelow, the present invention is described in detail with reference to the drawings. Furthermore, the present invention is not limited by the following embodiments. Furthermore, the constitutional elements of the following embodiments include the constitutional elements that can be easily figured out by a person skilled in the pertinent art or the constitutional elements that are substantially identical.

Furthermore, in the present specification, the repeating unit constituting the polymer is referred to as a monomer unit. However, the monomer unit may indicate those in the state of being included in the polymer, or may indicate the monomer itself that is present singly.

[Development of Pattern Forming Material]

For the process of manufacturing a semiconductor device, a technique of processing a to-be-processed film to have a pattern with high aspect ratio has been desired. By having a mask pattern formed on top of a to-be-processed film as a mask, the to-be-processed film is processed by dry etching or the like. The mask pattern is exposed to etching gas or the like for a long period of time. Due to this reason, development of a pattern forming material which enables obtainment of a mask pattern with high etching resistance is required.

Furthermore, as another method for obtaining a pattern with high aspect ratio, there is also a case in which a stacked mask structure having a multi-layered mask pattern is employed. In this case, by combining an organic film with another organic film or combining an organic film with an inorganic film and utilizing a difference in etching resistance of each film to various etching gases, a mask pattern with thick film is obtained. When such stacked mask structure is formed, it is convenient to employ a method in which a solution having materials of each film dissolved in an organic solvent or the like is applied in order.

In consideration of the issues that are described above, the present inventors started to develop a pattern forming material which can be applied to a stacked mask structure and also enables obtainment of a mask pattern with high etching resistance. Contents thereof are described hereinbelow.

(Metallization of Polymer)

The present inventors found that a certain kind of a polymer can be metallized. In addition, the metallized polymer exhibited high etching resistance. Metallization of a polymer indicates infiltration of a certain kind of a metal in a polymer.

Specifically, when a certain kind of a polymer is subjected to an oxidation treatment according to exposure to a precursor that is used for a chemical vapor deposition (CVD) method or an atomic layer deposition (ALD) method, a metal compound can be deposited inside the polymer matrix. For example, when a polymethyl methacrylate (PMMA) as a polymer is exposed to trimethyl aluminum (TMA), which is a precursor, by using a vacuum device such as ALD apparatus and treated with $H_2O$, the aluminum compound is deposited inside the PMMA-matrix. For a general ALD process, TMA is adsorbed as a single layer onto the OH group on a substrate surface. However, the deposition process of an aluminum compound inside a polymer matrix is believed to have a mechanism that is different from it.

Biswas et. al. suggested a mechanism in which TMA approaches the carbonyl group in PMMA and then covalently binds to the carbonyl group (M. Biswas, J. A. Libera, S. B. Darling, J. W. Elam, Chem. Mater., vol. 26, 6135, 2014.). In order to confirm the approach and binding of TMA to the carbonyl group, determination was made by Density Functional Theory (DFT) method using a molecular orbital calculation program.

Calculation of the molecular structure was carried out by using a molecular orbital calculation program ("Gaussian09 manufactured by HPC SYSTEMS). As a functional of the density functional theory, B3LYP was used. As a basic functional system for TMA containing aluminum and polymer, 6-31G was used, and as a basic functional system for precursor containing heavy metals and polymer, LanL2DZ was used.

Furthermore, as for the precursor, optimization of the molecular structure was carried out by using an energy gradient method, and the stabilization energy E1 of a stabilized state of the precursor was calculated. As for the polymer, a structure in which three segments are linked to one another was used as a model, and, by carrying out the optimization of structure with the same parameter and method as the precursor, the stabilization energy E2 of a stabilized state of the polymer was calculated. Next, from various directions, a precursor was brought close to the center segment of a polymer serving as a model, and, by carrying out the optimization of the structure similarly to above, the stabilization energy E3 of a state in which the precursor is adsorbed onto the polymer was calculated. Finally, the stabilization energy $\Delta E=E1+E2-E3$ was obtained. In this case, it means that, as the stabilization energy $\Delta E$ has a higher negative value, that is, shows a smaller number, the precursor is more stably adsorbed onto the polymer.

Figure 1B:
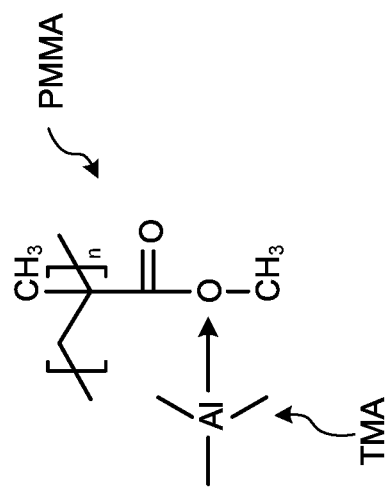
FIG. 1B is a diagram illustrating the stabilization energy ΔE when a precursor is brought close to the polymer.
Figure 1A:
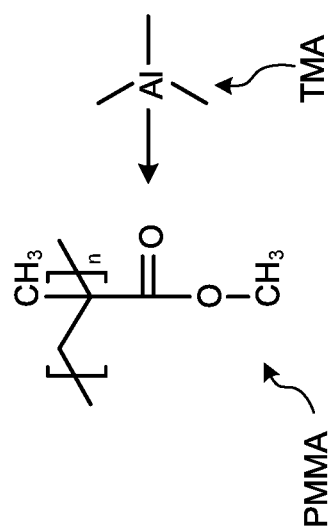
FIG. 1A is a diagram illustrating the stabilization energy ΔE when a precursor is brought close to the polymer.

In FIG. 1A to FIG. 1C, the results of determining PMMA and polystyrene (PS) as a representative polymer are illustrated. FIG. 1A to FIG. 1C are the diagrams illustrating the stabilization energy $\Delta E$ when a precursor is brought close to the polymer. In FIG. 1A and FIG. 1B, PMMA is used as a polymer. In FIG. 1C, PS is used as a polymer. As a precursor, TMA is used for all of them.

As indicated with an arrow in FIG. 1A, when TMA is brought close to the carbonyl group of an ester group of PMMA, TMA is closely drawn to the carbonyl group, and the stabilization energy $\Delta E$ decreases to −14.17 kcal/mol, showing stabilization. The distance between the carbonyl group contained in an ester group and the aluminum in TMA is 0.203 nm, which is sufficiently a small value, and thus it is found that TMA is stabilized in a state in which it is close to the carbonyl group of an ester group.

As indicated with an arrow in FIG. 1B, when TMA is brought close to the ether side of an ester group of PMMA, TMA is dissociated and the stabilization energy $\Delta E$ is −3.71 kcal/mol, showing almost no decrease.

As indicated with an arrow in FIG. 1C, when TMA is arranged near the benzene ring of PS, TMA is not closely drawn, and the stabilization energy $\Delta E$ is −2.67 kcal/mol, showing almost no decrease.

From the above, it is found that TMA is closely drawn to a structure like carbonyl group (ketone) having lone pair. It is believed that, due to this reason, TMA is selectively adsorbed onto PMMA having a carbonyl group. Because PS has no site for stabilizing TMA in the structure, TMA cannot be adsorbed inside PS matrix.

Furthermore, as a result of comparing the stabilization energy $\Delta E$ of TMA and various polymers other than PMMA, it was also found that a polymer having a carbonyl group inside the molecular structure stably adsorbs TMA. In addition, it was also possible that a polymer having a pyridine skeleton or cyano group stably adsorbs TMA. It is believed that the stabilization of TMA is caused by lone pair included in the nitrogen atom of a pyridine skeleton or a cyano group. Furthermore, in this case, the distance between the oxygen atom of a carbonyl group or the nitrogen atom of a pyridine skeleton or a cyano group and the aluminum of TMA roughly exists within a range of approximately 0.20 nm to 0.22 nm. It is believed that TMA cannot be stabilized when the distance between each atoms is larger than such distance.

Meanwhile, it is known that TMA commonly forms a dimer at room temperature. Once two molecules of TMA are associated with each other to form a dimer, the stabilization energy $\Delta E$ decreases to −11.09 kcal/mol compared to a case in which each TMA is present as a single molecule, and thus it is recognized that the dimer is more stable than single TMA. On the contrary, when TMA is adsorbed onto PMMA, the stabilization energy $\Delta E$ is −14.17 kcal/mol, and thus TMA adsorbed onto PMMA is slightly more stable than a case in which it is present in a dimer. However, the difference is only 3.08 kcal/mol, which makes it possible for single TMA to return to a dimer by a slight heat disturbance.

From the above, it is believed that, once PMMA is exposed to TMA, a TMA dimer diffuses inside the PMMA. In addition, once the TMA reaches near the carbonyl group of an ester group in a side chain of PMMA, it becomes more advantageous for TMA to become a monomer and get associated with the carbonyl group. As a result, TMA is captured by PMMA. However, in terms of the energy, TMA captured by PMMA is slightly more stable than TMA dimer, and thus there is also a case in which it is dissociated again and diffuses inside the PMMA. As such, if the concentration of TMA is increased to a certain level, a large amount of TMA can be stably adsorbed inside PMMA.

It is also believed that, when TMA is exposed to an oxidizing agent like water vapor ($H_2O$) in a state in which TMA has been adsorbed inside PMMA, TMA adsorbed onto the PMMA is oxidized to give an aluminum compound. Like this, infiltrating a precursor like TMA in a polymer matrix and depositing a single metal or a metal compound in a polymer is referred to as metallization of a polymer. As described above, PMMA can be metallized by depositing an aluminum compound inside PMMA.

(Relationship Between Stabilization Energy and Metallization)

Herein, relation between the stabilization energy $\Delta E$ obtained by a Density Functional Theory method and degree of metallization caused by adsorption was examined.

Various kinds of a polymer were applied on a substrate, exposed for 600 s to TMA, and then oxidized by $H_2O$. Because the polymer was prepared as an unpatterned film, when the aluminum compound is deposited inside the film, the film expanded in volume. The expansion was only in longitudinal direction, resulting in an increase of film thickness. According to this method, a higher increase in film thickness was obtained with a polymer which shows a greater decrease in the stabilization energy $\Delta E$.

Furthermore, the stabilization energy $\Delta E$ below −12 kcal/mol or so, a higher increase in film thickness was shown by metallization. This result suggests that, as the stabilization energy $\Delta E$ of a TMA dimer is −11.09 kcal/mol, the reaction does not proceed if the association energy between TMA and a polymer is below the dissociation energy of a TMA dimer.

Among them, only poly-tert-butyl methacrylate (PtBuMA) and 2,2,2-trifluoroethyl methacrylate (PTFEMA) are outside the above tendency. With regard to PtBuMA, it is believed that decomposition has progressed during the process at 100° C. for 1 hour or so. With regard to PTFEMA, there is a possibility that TMA cannot enter the polymer as it has a hydrophobic fluorine atom in the molecular structure.

As described above, aside from a couple of exceptions, positive relation was found between the stabilization energy $\Delta E$ obtained by a density functional theory method and actual increase in film thickness. This result indicates that the easiness of metallization can be predicted in advance by a density functional theory method. Accordingly, a material more prone to metallization can be obtained by calculation, thus making the material design easier.

(Side Chain Structure and Stabilization Energy of Precursor)

Next, determination is made for a difference in the stabilization energy $\Delta E$ of TMA that is caused by a structural difference of a side chain.

For instance, polyvinyl acetate (PVA) has the same molecular structure as PMMA but has a side chain with different arrangement. However, compared to PMMA, PVA exhibited a higher decrease in the stabilization energy $\Delta E$. This is believed to be based on the reason that the carbonyl group contained in PVA is placed further away from the side chain, and as the electron pair of the oxygen atom of the carbonyl group is protruded to the outer side, there is less steric hindrance compared to PMMA.

(Stabilization Energy of Precursor and Carbonyl Group in Side Chain)

As described above, a precursor like TMA adsorbs onto a carbonyl group contained in a side chain of a polymer. Based on this, there is a possibility that adsorption of even more precursors is achieved by increasing the density of a carbonyl group in a side chain.

Accordingly, determination was made for the polymer which contains plural carbonyl groups in a side chain.

FIG. 2A to FIG. 2C are the diagrams illustrating the stabilization energy $\Delta E$ when a precursor is brought close to the polymer which contains two carbonyl groups in a side chain. As illustrated in FIG. 2A to FIG. 2C, for polyacetonyl methacrylate (PAcMA) as a polymer containing two carbonyl groups in a side chain, the stabilization energy $\Delta E$ was calculated when TMA is adsorbed onto the two carbonyl groups.

As illustrated in FIG. 2A, when TMA is brought close to the carbonyl group B1 which is present near the main chain of PAcMA, TMA is closely drawn to the carbonyl group B1 and the stabilization energy $\Delta E$ decreases to −12.55 kcal/mol.

As illustrated in FIG. 2B, when TMA is brought close to the carbonyl group B2 which is placed distantly from the main chain of PAcMA, TMA is closely drawn to the carbonyl group B2 and the stabilization energy $\Delta E$ decreases to −15.99 kcal/mol.

It was found that, when TMA is arranged near the ether of PAcMA, it moves to the vicinity of the carbonyl group B2 on the outer side. It is believed that more stable adsorption of TMA onto the carbonyl group B2 on the outer side like this is caused by smaller steric hindrance.

As illustrated in FIG. 2C, when two TMAs are brought close to PAcMA, each of the two TMAs is stabilized near the two carbonyl groups B1 and B2, and the stabilization energy $\Delta E$ decreases to −25.89 kcal/mol. This is a value which is almost twice the value of having adsorption of single TMA. Based on this result, it is expected that, even after one TMA is adsorbed onto a first carbonyl group, adsorption of another TMA onto a second carbonyl group is not inhibited.

Figure 3A:
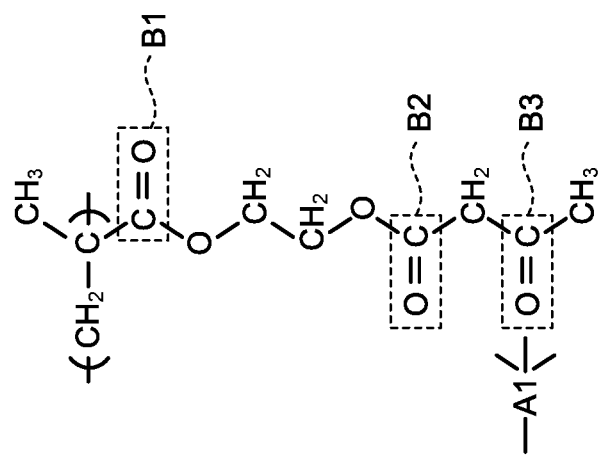
FIG. 3A is a diagram illustrating the stabilization energy ΔE when a precursor is brought close to the polymer which contains three carbonyl groups in a side chain.
Figure 3B:
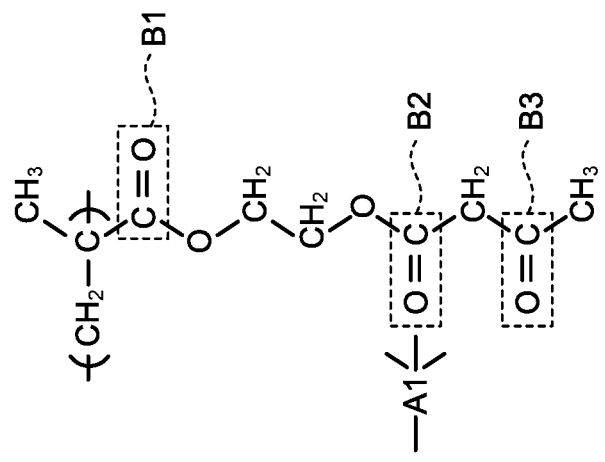
FIG. 3B is a diagram illustrating the stabilization energy ΔE when a precursor is brought close to the polymer which contains three carbonyl groups in a side chain.
Figure 3C:
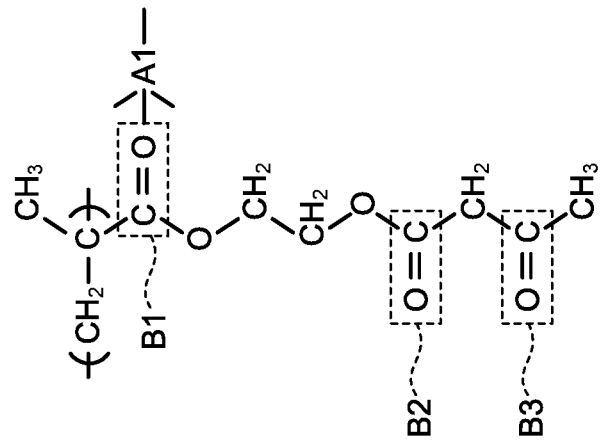
FIG. 3C is a diagram illustrating the stabilization energy ΔE when a precursor is brought close to the polymer which contains three carbonyl groups in a side chain.

FIG. 3A to FIG. 3C are the diagrams illustrating the stabilization energy $\Delta E$ when a precursor is brought close to the polymer which contains three carbonyl groups in a side chain. As illustrated in FIG. 3A to FIG. 3C, for poly-2-acetoacetoxyethyl methacrylate (PacacEMA) as a polymer containing three carbonyl groups in a side chain, the stabilization energy $\Delta E$ was calculated when TMA is adsorbed onto the three carbonyl groups.

As illustrated in FIG. 3A, when TMA is brought close to the carbonyl group B1 which is placed near the main chain of PacacEMA, TMA is closely drawn to the carbonyl group B1 and the stabilization energy $\Delta E$ decreases to −14.53 kcal/mol.

As illustrated in FIG. 3B, when TMA is brought close to the carbonyl group B2 which is placed in the middle of the side chain of PacacEMA, TMA is closely drawn to the carbonyl group B2 and the stabilization energy $\Delta E$ decreases to −17.47 kcal/mol.

As illustrated in FIG. 3C, when TMA is brought close to the carbonyl group B3 which is placed most distantly away from the main chain of PacacEMA, TMA is closely drawn to the carbonyl group B3 and the stabilization energy $\Delta E$ decreases to −15.82 kcal/mol.

As shown above, among the carbonyl groups B1 to B3, TMA adsorbs most stably onto the carbonyl group B2 in the middle.

Figure 4A:
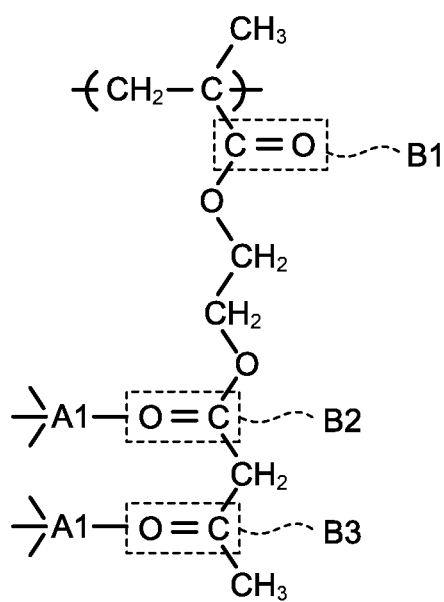
FIG. 4A is a diagram illustrating the stabilization energy ΔE when a precursor is brought close to the polymer which contains three carbonyl groups in a side chain.
Figure 4B:
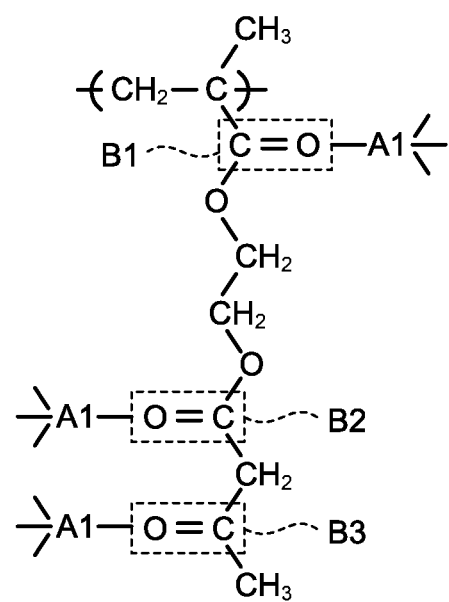
FIG. 4B is a diagram illustrating the stabilization energy ΔE when a precursor is brought close to the polymer which contains three carbonyl groups in a side chain.

FIG. 4A and FIG. 4B are the diagrams illustrating the stabilization energy $\Delta E$ when a precursor is brought close to the polymer which contains three carbonyl groups in a side chain. As illustrated in FIG. 4A and FIG. 4B, the stabilization energy $\Delta E$ was calculated when TMA adsorbs onto each of plural carbonyl groups of PacacEMA.

As illustrated in FIG. 4A, when two TMAs are brought close to PacacEMA, each of the two TMAs is stabilized near the two carbonyl groups B2 and B3 on the outer side, and the stabilization energy ΔE decreases to −30.84 kcal/mol. The difference in total of the stabilization energy when TMA adsorbs onto each carbonyl group is 2.45 kcal/mol.

As illustrated in FIG. 4B, when three TMAs are brought close to PacacEMA, each of the three TMAs is stabilized near the three carbonyl groups B1 to B3, and the stabilization energy ΔE decreases to −43.81 kcal/mol. The difference in total of the stabilization energy when TMA adsorbs onto each carbonyl group is 4.01 kcal/mol.

As described above, even by simultaneous adsorption of three TMAs on PacacEMA, it was found to be not disadvantageous in terms of the energy. In this regard, it is believed that, as the acetylacetate in the side chain of PacacEMA has freedom of rotation, the molecular chain can still rotate even when the carbonyl group on the outer side is filled with TMA and no hindrance is caused for the adsorption of TMA onto the carbonyl group on the inner side.

(Comparison Between Linear Chain and Alicycle)

As described above, it was found that, when plural carbonyl groups are present in a side chain of a polymer, adsorption characteristics of a precursor vary in accordance with the position or surrounding environment of the carbonyl groups.

Accordingly, determination was made for a polymer having a linear side chain and also a polymer having a cyclic side chain.

Figure 5:
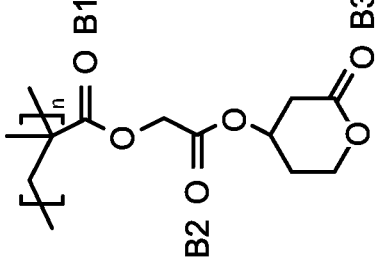
FIG. 5 is a diagram illustrating the stabilization energy ΔE when the side chain of a polymer is either linear or cyclic.

FIG. 5 is the diagram illustrating the stabilization energy ΔE when the side chain of the polymer is either linear or cyclic (alicyclic). To enable comparison of the stabilization energy ΔE for cases in which the side chain of the polymer is either linear or cyclic, position of the carbonyl group was set such that it is equally apart from the main chain of the polymer.

As illustrated in FIG. 5, it was found that, regardless of the fact that the side chain of the polymer is either linear or cyclic, the stabilization energy ΔE decreases most significantly when TMA is adsorbed onto the farthest side from the main chain among the plural carbonyl groups in the side chain of the polymer. Namely, it was most stable when TMA is adsorbed onto the outermost side (terminal) of the side chain of a polymer. Furthermore, regardless of the type of a side chain, that is, either linear or cyclic, it was found that the stabilization energy ΔE of the three carbonyl groups shows smaller decrease amount as they are carbonyl groups at the inner side (near the main chain). Namely, it is expected that TMA is first adsorbed to the carbonyl group which is present on the outer side of the side chain.

Based on the above, it is recognized that, to have more adsorption of TMA, it is important to have TMA adsorbed first onto the carbonyl group present on the outermost side of the side chain.

Meanwhile, when comparison is made between a case in which the side chain of a polymer is linear and a case in which the side chain of a polymer is cyclic, it is found that a higher decrease of the stabilization energy is shown from the linear case than the cyclic case. For example, the stabilization energy ΔE of the outermost carbonyl group B3 which is equally apart from the main chain is −19.56 kcal/mol when the side chain is linear, −17.90 kcal/mol when the side chain is a homocycle not containing any oxygen atom in the alicycle, or −17.80 kcal/mol when the side chain is a heterocycle containing an oxygen atom in the alicycle. They are believed to be caused by a difference in level of steric hindrance in the side chain structure.

From the above, it is considered that, a polymer having a similar molecular structure, a polymer having a linear side chain is advantageous for metallization than a polymer having a cyclic side chain.

(Various Precursors)

It is considered that different adsorption characteristics are yielded not only in accordance with a structure of a polymer and a side chain thereof, but also in accordance with a type of a precursor. For example, there are cases in which the precursor has a different metal atom.

Accordingly, adsorption characteristics of $TiCl_4$, tetrakis-dimethylamino titanium (TDMAT), $WCl_6$, and $VCl_4$ as a precursor having a metal atom other than aluminum were examined.

When $TiCl_4$ is brought close to the carbonyl group of PMMA, $TiCl_4$ is drawn closely to the carbonyl group and the stabilization energy ΔE decreases to −14.07 kcal/mol, showing stabilization. The titanium atom of $TiCl_4$ has been brought close to the oxygen atom of the carbonyl group of PMMA as close as 0.203 nm. Furthermore, in this case, the stabilization was made in the form in which the bonding angle of chlorine atoms bound to the titanium are open wider.

When TDMAT is brought close to the carbonyl group of PMMA, no stabilization is achieved as the ligand of TDMAT is bulky and cannot approach the vicinity of the carbonyl group. Considering that $TiCl_4$ can be adsorbed onto a carbonyl group, it is believed that, although Ti itself has affinity for the oxygen atom of a carbonyl group, it is necessary to have a precursor of which ligand is small enough.

When $WCl_6$ is brought close to the carbonyl group of PMMA, $WCl_6$ is drawn closely to the carbonyl group and the stabilization energy ΔE decreases to −10.13 kcal/mol, showing stabilization. The tungsten atom of $WCl_6$ has been brought close to the oxygen atom of the carbonyl group of PMMA as close as 0.212 nm.

When $VCl_4$ is brought close to the carbonyl group of PMMA, $VCl_4$ is drawn closely to the carbonyl group and the stabilization energy ΔE decreases to −14.47 kcal/mol, showing stabilization. The vanadium atom of $VCl_4$ has been brought close to the oxygen atom of the carbonyl group of PMMA as close as 0.200 nm.

As described above, it was recognized that, a precursor having not only aluminum but also various kinds of metal can be applied if the ligand is small enough.

(Polymer Insolubilization)

From the various examination results that are described above, several characteristics of a polymer that are suitable for metallization can be mentioned. Namely, it is preferable that the monomer unit constituting the polymer is composed of a (meth)acrylic acid ester skeleton. Furthermore, it is preferable to have, in the monomer unit, plural carbonyl groups by containing ester skeleton. It is also preferable that, among plural carbonyl groups, the carbonyl group farthest away from the main chain is present on a linear chain.

However, there can be a case in which it is difficult to apply the above polymer directly to a stacked mask structure. That is because, as it has been described before, there is a case in which materials constituting a stacked mask are repeatedly applied after being dissolved in an organic solvent or the like and the polymer is soluble in such an organic solvent. Once a solvent is applied on top of a polymer, the polymer is partially dissolved and mixing with a material constituting an upper layer film may occur.

Thus, the present inventors configured an idea of copolymerizing the aforementioned monomer unit with a monomer having a crosslinkable functional group and using a resulting copolymer (copolymerization product) as a pattern forming material. Accordingly, polymer insolubilization can be achieved and a film can be formed by coating an upper layer with a solvent having different constitutional materials.

According to the present inventors, the monomer having a crosslinkable functional group is not particularly limited as long as the monomer can exhibit the crosslinking function adopting energy from outside. As a specific example, those having an oxirane structure (glycidyl group) at side chain terminal or those having an oxetane structure (oxetanyl group) at side chain terminal can be used.

EMBODIMENTS

Next, embodiments are described by using figures.
(Pattern Forming Material)

The pattern forming material of an embodiment contains a polymer which is composed of two or more kinds of a monomer unit. Among the monomer units, the first monomer unit is provided with plural carbonyl groups. The second monomer unit is provided with a crosslinkable functional group at the side chain terminal.

Figure 6:
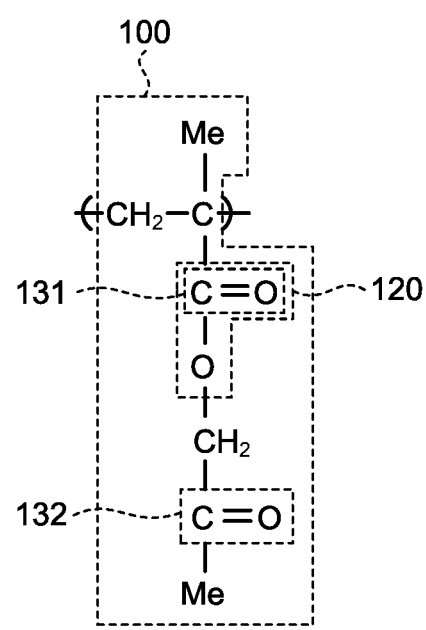
FIG. 6 is a chemical formula illustrating one example of a first monomer unit according to an embodiment.

FIG. 6 is a chemical structural formula illustrating one example of the first monomer unit 100 according to an embodiment.

As illustrated in FIG. 6, the first monomer unit 100 is provided with the ester skeleton 120 having the first carbonyl group 131 and at least one second carbonyl group 132 which binds to the ester skeleton 120.

In FIG. 6, as the first monomer unit 100, an example in which a polymer main chain is formed according to opening of the double bond of the ethylene group in acetonyl methacrylate (AcMA) is illustrated. At both terminals of the open ethylene group, other plural first monomer units 100 are bound to constitute a polymer. Meanwhile, there is also a case in which the second monomer unit, which will be described later, binds to one terminal or both terminals of the ethylene group.

Furthermore, among at least one second carbonyl group, the second carbonyl group 132 which is the farthest away from the main chain of a polymer constituting the pattern forming material is present on a linear chain.

In FIG. 6, the side chain of the first monomer unit 100, which is composed of AcMA, is linear without having any alicyclic structure, a benzene ring, or the like. In addition, AcMA is provided with one second carbonyl group 132, and the second carbonyl group 132 which is present on the outermost side (terminal) of the side chain is present on a linear chain. Namely, the second carbonyl group 132 binds to the linear chain part of the ester skeleton 120.

Figure 7:
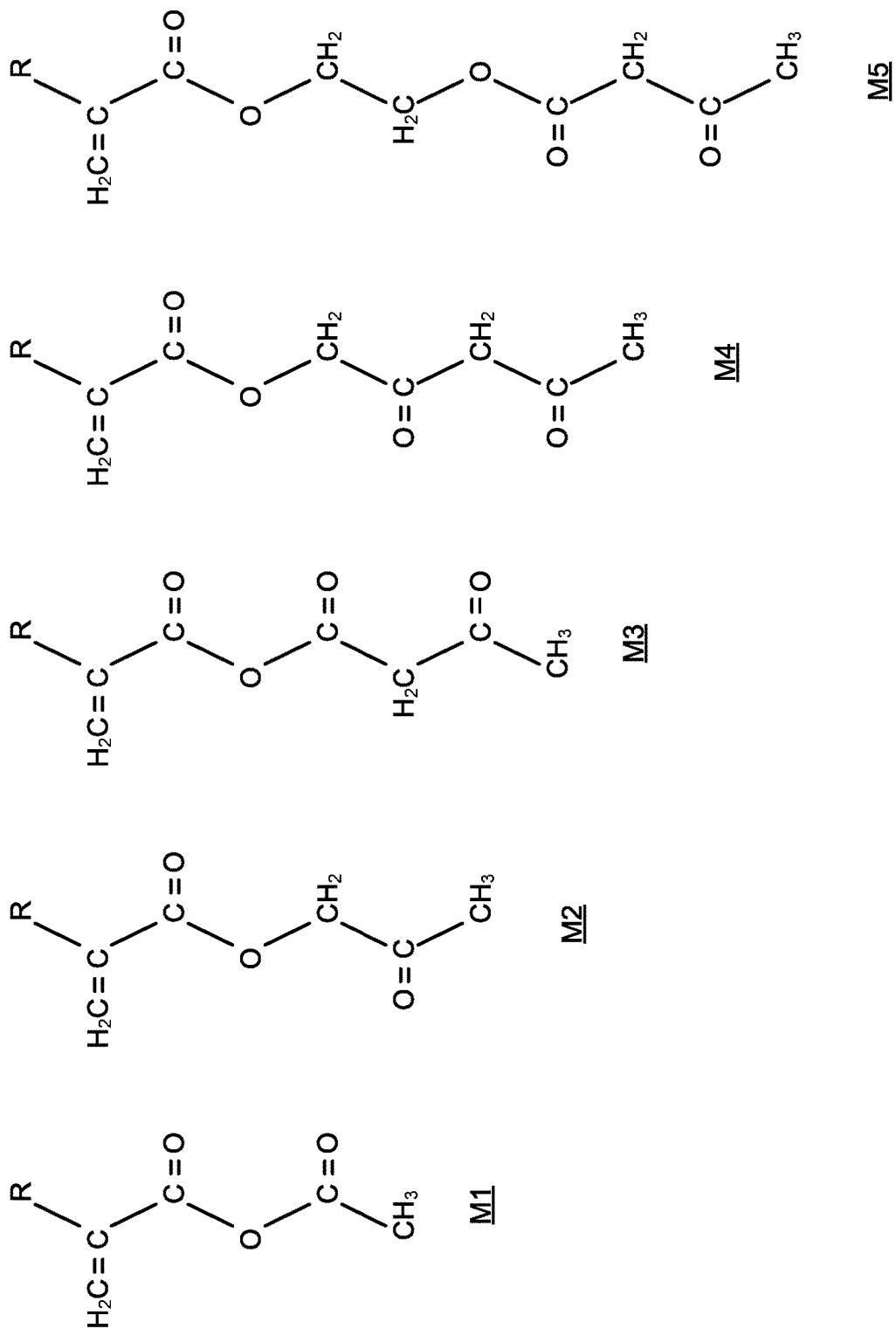
FIG. 7 is a chemical formula illustrating an example of a monomer which constitutes a first monomer unit according to an embodiment.

In FIG. 7, examples of other monomers constituting the first monomer unit 100 are illustrated. FIG. 7 is a chemical formula illustrating an example of a monomer which constitutes the first monomer unit 100 according to an embodiment. In FIG. 7, a monomer having at least one second carbonyl group is illustrated with a general formula. "R" in the general formula indicates hydrogen (H) or a methyl ($CH_3$) group.

The monomers M1 and M2 have a single second carbonyl group. Namely, the monomers M1 and M2 have two carbonyl groups in total in the side chain. Examples of the monomer M1 include acetylacrylic acid anhydride. Examples of the monomer M2 include acetonyl methacrylate which has been described before.

The monomers M3 to M5 have two second carbonyl groups. Namely, the monomers M3 to M5 have three carbonyl groups in total in the side chain. Examples of the monomer M3 include 2-acetoacetyl methacrylate. Examples of the monomer M4 include 2,4-dioxopentyl methacrylate. Examples of the monomer M5 include acetoacetyloxyethyl methacrylate.

Examples of the first monomer unit 100 other than those include acetonyl acrylate, acetoacetyloxyethyl acrylate, acetyl methacrylic acid anhydride, 2-acetoacetyl acrylate, and 2,4-dioxopentyl acrylate.

The first monomer unit 100 may be composed of at least one of those monomers M1 to M5. As a precursor is adsorbed onto the first monomer unit 100 and a metal compound is deposited, a polymer constituting the pattern forming material of an embodiment is metallized.

Examples of the metal to be included in a precursor include aluminum, titanium, tungsten, vanadium, hafnium, zirconium, tantalum, and molybdenum. Among organometallic compounds or halides of them, those provided with a sufficiently small ligand can be used as a precursor.

Specifically, an applicable precursor may contain at least one of $AlCl_3$, $TiCl_4$, $WCl_6$, $VCl_4$, $HfCl_4$, $ZrCl_4$, and trimethylaluminum (TMA).

Figure 8:
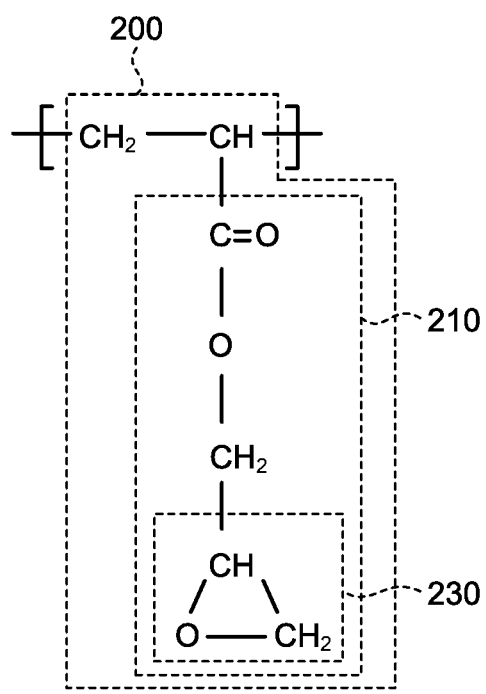
FIG. 8 is a chemical formula illustrating one example of a second monomer unit according to an embodiment.

FIG. 8 is a chemical formula illustrating one example of the second monomer unit 200 according to an embodiment.

As illustrated in FIG. 8, the second monomer unit 200 is provided with a crosslinkable functional group 230 at the terminal of the side chain 210. The crosslinkable functional group 230 may contain at least one of oxirane structure (glycidyl group) and oxetane structure (oxetanyl group).

In FIG. 8, as the first monomer unit 100, an example in which part of a polymer main chain is formed according to opening of the double bond of the ethylene group in glycidyl acrylate (GAA) is illustrated. At both terminals of the opened ethylene group, plural first monomer units 100 are bound to constitute a polymer. Meanwhile, there is also a case in which another second monomer unit 200 binds to one terminal or both terminals of the ethylene group. GAA is provided with, at a terminal of the side chain 210, a glycidyl group which becomes the crosslinkable functional group 230.

In FIG. 9, examples a monomer constituting the second monomer unit 200 are illustrated. FIG. 9 is a chemical formula illustrating an example of a monomer which constitutes the second monomer unit 200 according to an embodiment.

Examples of the monomer provided with a glycidyl group at the side chain terminal as illustrated in FIG. 9 include, other than the aforementioned glycidyl acrylate (GAA), glycidyl methacrylate (GMA), 4-hydroxybutyl acrylate glycidyl ether (4HBAGE), and 4-hydroxybutyl methacrylate glycidyl ether (4HBMGE). Examples of the monomer provided with an oxetanyl group at the side chain terminal include (3-ethyl-3-oxetanyl)methyl acrylate (3E3OMAA) and (3-ethyl-3-oxetanyl)methyl methacrylate (3E3OMMA).

The second monomer unit 200 may be composed of at least one of those monomers. The polymer constituting the pattern forming material of an embodiment has a structure in which the second monomer unit 200 is included in a main chain that is constituted mainly with the first monomer unit 100. As the crosslinkable functional groups of the second monomer unit 200, which is included in another polymer chain, bind to each other, each main chain of the plural polymer chains are crosslinked, which results to insolubilization to solvents.

Abundance ratio of the second monomer unit 200 is, relative to the entire monomer units constituting the polymer, preferably 0.5% by mol or more and less than 20% by mol, more preferably 1% by mol or more and less than 10% by mol, and even more preferably 2% by mol or more and 5% by mol or less.

If the monomer having a crosslinkable functional group is less than 0.5% by mol in the whole, there is a possibility that the crosslinking in the polymer is insufficient and part of the polymer is dissolved out to a solvent. If the monomer having a crosslinkable functional group is 20% by mol or more in the whole, the crosslinking density becomes excessively high so that diffusion of a precursor to inside of the polymer is inhibited, thus yielding no metallization deep inside the polymer.

It is also possible to add a curing agent to the polymers constituting the pattern forming material of an embodiment to crosslink each other.

The curing agent is reactive to the crosslinkable functional group, and, via a curing agent, the crosslinkable functional groups can bind to each other. The crosslinking reaction is promoted by a curing agent so that crosslinking between polymers can be easily achieved. Accordingly, a suitable curing agent may vary depending on a type of the second monomer unit 200. For example, in case of glycidyl methacrylate, an amine compound, a compound having an acid anhydride skeleton, a compound having carboxylic acid, and a compound having a hydroxyl group can be preferably used as a curing agent.

The amine compound has, inside a skeleton, plural primary amines or secondary amines. Examples of the amine compound which can be used as a curing agent include ethylenediamine, trimethylenediamine, tetramethylenediamine, pentamethylenediamine, hexamethylenediamine, heptamethylenediamine, octamethylenediamine, nonamethylenediamine, decamethylenediamine, diethylenetriamine, triethylenetetramine, tetraethylenepentamine, pentaethylenehexamine, 1,2-diaminocyclohexane, 1,3-diaminocyclohexane, 1,4-diaminocyclohexane, o-phenylenediamine, m-phenylenediamine, p-phenylenediamine, m-xylenediamine, p-xylenediamine, isophoronediamine 4,4'-methylenedianiline, diamide diphenylsulfone, and diaminodiphenyl ether.

Examples of the compound having an acid anhydride skeleton which can be used as a curing agent include hexahydrophthalic acid anhydride, 4-methylhexahydrophthalic acid anhydride, succinic acid anhydride, itaconic acid anhydride, and dodecenylsuccinic acid anhydride.

Examples of the compound having carbonic acid which can be used as a curing agent include hexahydrophthalic acid, 4-methylhexahydrophthalic acid, succinic acid, itaconic acid, dodecenylsuccinic acid, citric acid, and terephthalic acid.

The compound having a hydroxyl group contains plural hydroxyl groups in the skeleton. Examples of the compound having a hydroxyl group which can be used as a curing agent include polyphenol, 1,4-benzene diol, 1,3-benzene diol, 1,2-benzene diol, and ethylene glycol.

Furthermore, in order to enhance the reactivity of a curing agent other than the amine compounds that are described above, a curing promoter having tertiary amine can be also added. Examples of the curing promoter include cyandiamide, 1,8-diazabicyclo(5,4,0)-undecene-7, 1,5-diazabicyclo(4,3,0)-noene-5, tris(dimethylaminomethyl)phenol, and ethylene glycol.

It is also possible that the polymer constituting the pattern forming material of an embodiment includes other monomer units.

By having a copolymer with a monomer unit which is different from the first monomer unit 100 and the second monomer unit 200 that are described above, solubility of the polymer in solvent, film forming property during film formation, glass transition temperature of a film after film formation, or the like can be adjusted.

Examples of the monomer constituting a heterogeneous monomer unit include styrene, hydroxystyrene, methyl (meth)acrylate, ethyl (meth)acrylate, and hydroxyethyl (meth)acrylate.

The heterogeneous monomer unit may be constituted with at least one of those monomers. Abundance ratio of the heterogeneous monomer unit is, relative to the entire monomer units constituting the polymer, preferably less than 50% by mol. As the heterogeneous monomer unit is less than 50% by mol, density of carbonyl groups in the polymer is maintained at high level so that even more metals can be deposited in the polymer.

The pattern forming material of an embodiment may also be in a solution state.

The solvent is not particularly limited as long as the solvent can dissolve the pattern forming material. Examples of the solvent include 1-butanol, N,N-dimethyl formamide, N-methyl pyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-normal-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-normal-butyl ether, propylene glycol monomethyl ether, propylene glycol monomethyl ether acetate, methyl ethyl ketone, methylcyclohexanol, methylcyclohexanone, methyl-normal-butyl ketone, isobutyl acetate, isopropyl acetate, isopentyl acetate, ethyl acetate, normal-butyl acetate, normal-propyl acetate, and normal-pentyl acetate.

(Pattern Forming Treatment)

Next, by using FIG. 10A to FIG. 10C, FIG. 11A to FIG. 11C, and FIG. 12A to FIG. 12C, the pattern forming treatment as a treatment for manufacturing the semiconductor device of an embodiment is described. FIG. 10A to FIG. 10C, FIG. 11A to FIG. 11C, and FIG. 12A to FIG. 12C are the flowchart illustrating one example of the order of the pattern forming treatment according to an embodiment. In the present embodiment, to process the to-be-processed film 20 which has been formed on the semiconductor substrate 10, the mask film 32 is formed from the pattern forming material 31. On top of the mask film 32, the SOG (Spin On Glass) film 40 is further formed as a functional film for carrying out patterning on the mask film 32.

First, the semiconductor substrate 10 formed with the to-be-processed film 20 is prepared. The to-be-processed film 20 may be either a single layer film such as silicon-oxide film or a stacked film on which a three-dimensional memory cell like NAND flash memory is constituted.

Figure 10A:
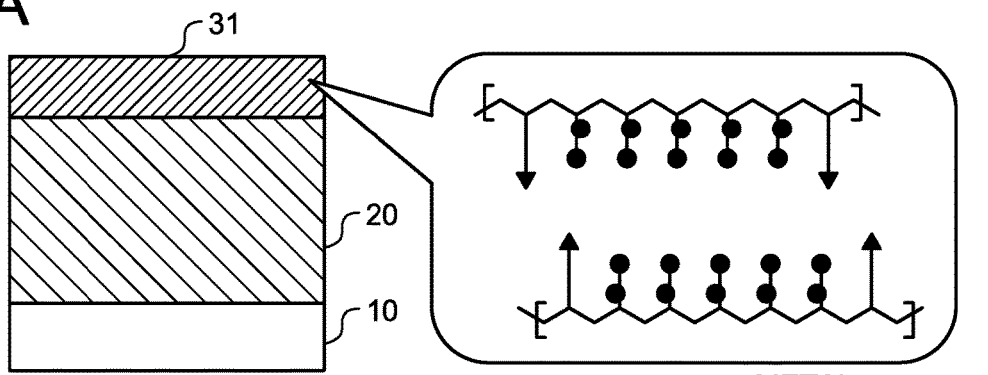
FIG. 10A to FIG. 10C are a flowchart illustrating one example of the order of pattern forming treatment according to an embodiment.

In addition, As illustrated in FIG. 10A, on top of the to-be-processed film 20 of the semiconductor substrate 10, the pattern forming material 31 of an embodiment is either applied or added dropwise. Methods like spin coating, dipping, and vapor deposition can be employed to form the pattern forming material 121. Circles in FIG. 10A represent a carbonyl group as a metal coordination site. Triangles represent a crosslinkable functional group. They represent the same for the following figures.

Figure 10B:
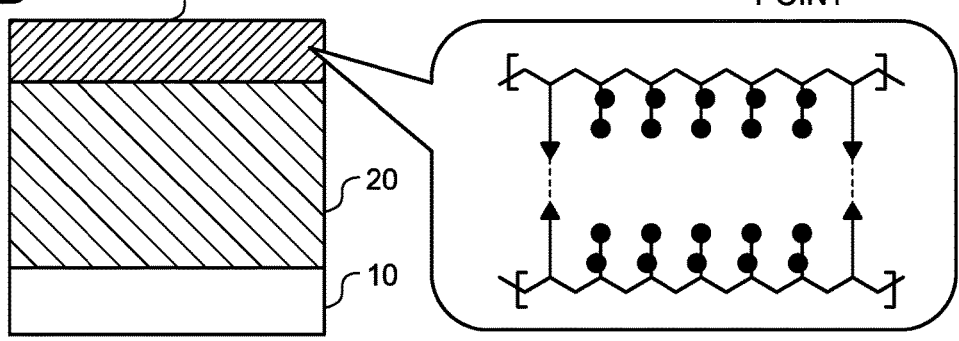

Next, As illustrated in FIG. 10B, the pattern forming material 31 is heated so that intramolecular crosslinking occurs to form the mask film 32 on top of the to-be-processed film 20.

Intramolecular crosslinking is achieved when crosslinkable functional groups present in different polymers bind to each other. In a case in which a curing agent or the like is added, binding between the crosslinkable functional groups progresses via the molecule of a curing agent. The heating temperature is preferably 120° C. or higher, more preferably 160° C. or higher, and even more preferably 200° C. or higher. However, in order to inhibit the decomposition of a polymer main chain, the heating temperature is preferably lower than 300° C. During the heating process, any remaining solvent or the like in which the pattern forming material 31 is dissolved in is removed. According to the above, the pattern forming material 31 which has been in a liquid phase is cured to yield the mask film 32.

Figure 10C:
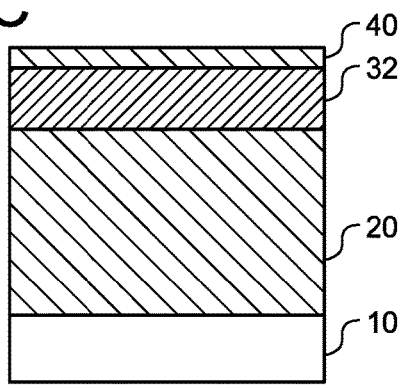

Next, as illustrated in FIG. 10C, the SOG film 40 is formed on top of the mask film 32. The SOG film 40 is formed by spin coating a solution, in which the components of the SOG film 40 are dissolved in. The SOG film 40 is formed on top of the mask film 32, after heating up to at a predetermined temperature.

An anti-reflection film which is not illustrated may be formed on the SOG film 40. The anti-reflection film prevents reflection from an under layer when patterning a resist film formed by the following treatment is carried out, and thus enabling fine exposure to light. As for the anti-reflection film, materials like a Novolac resin, a phenol resin, and polyhydroxystyrene may be used.

Figure 11A:
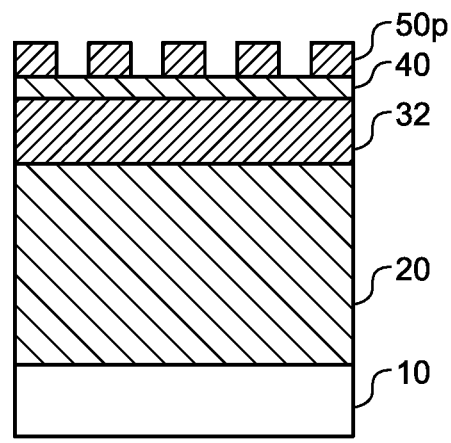
FIG. 11A to FIG. 11C are a flowchart illustrating one example of the order of pattern forming treatment according to an embodiment.

Subsequently, as illustrated in FIG. 11A, the resist pattern 50p is formed on top of the SOG film 40 by using a lithography technique or an imprint technique. According to the imprint technique, a resist is added dropwise on top of the SOG film 40, a template having a fine pattern formed therein is pushed against the resist, and the resist is cured by UV irradiation to form the resist pattern 50p. Thus, a structure in which the mask film 32, the SOG film 40, and the resist pattern 50p are stacked in the above stated order is an example of a stacked mask structure.

Figure 11B:
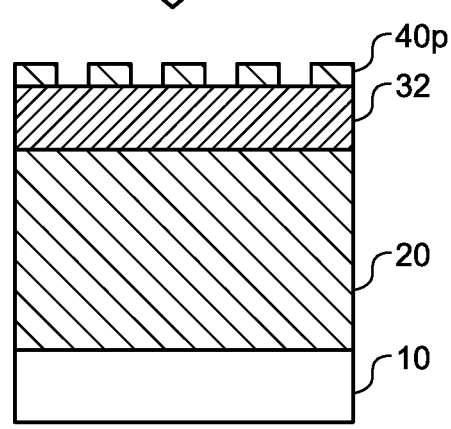

Next, as illustrated in FIG. 11B, the SOG film 40 is etched using the resist pattern 50p as a mask to form the SOG pattern 40p. In a case in which an anti-reflection film is formed on top of the SOG film 40, an anti-reflection film is patterned before the etching of the SOG film 40. Alternatively, it is also possible that film thickness of the resist pattern 50p is adjusted such that the resist pattern 50p can be removed when forming the SOG pattern 40p.

Figure 11C:
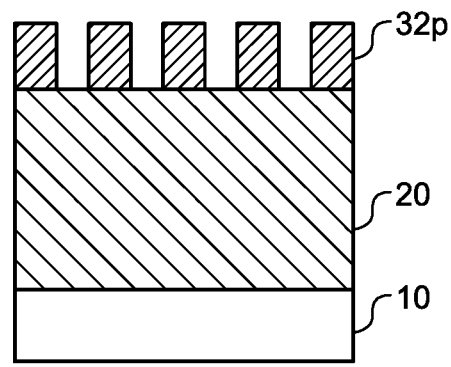

Next, as illustrated in FIG. 11C, the mask film 32 is etched using the SOG pattern 40p as a mask to form the mask pattern 32p. After forming the mask pattern 32p, the SOG pattern 40p is removed. Alternatively, it is also possible that film thickness of the SOG pattern 40p is adjusted such that the SOG pattern 40p can be removed when forming the mask pattern 32p.

Figure 12A:
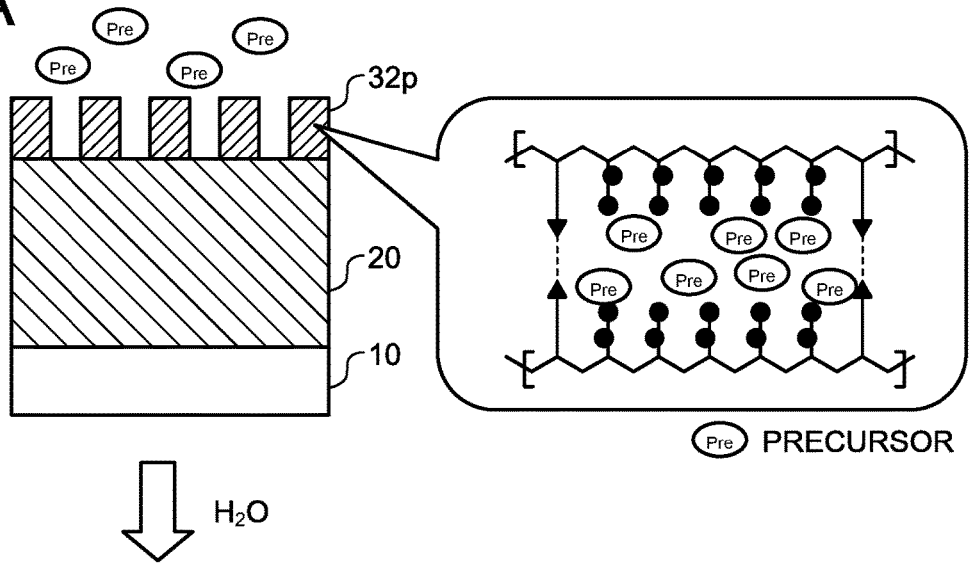
FIG. 12A to FIG. 12C are a flowchart illustrating one example of the order of pattern forming treatment according to an embodiment.

Subsequently, as illustrated in FIG. 12A, the semiconductor substrate 10 is introduced into a vacuum chamber, and the mask pattern 32p is exposed to gas or liquid of a precursor like TMA as metal-containing fluid, and subjected to a heating treatment at a temperature of 50° C. or higher but lower than 200° C. When treatment temperature is set at 50° C. or higher, the precursor molecule can be infiltrated inside a polymer matrix of the mask pattern 32p with more certainty. When treatment temperature is set to be lower than 200° C., the precursor molecule can be adsorbed onto carbonyl groups included in a polymer of the mask pattern 32p.

Figure 12B:
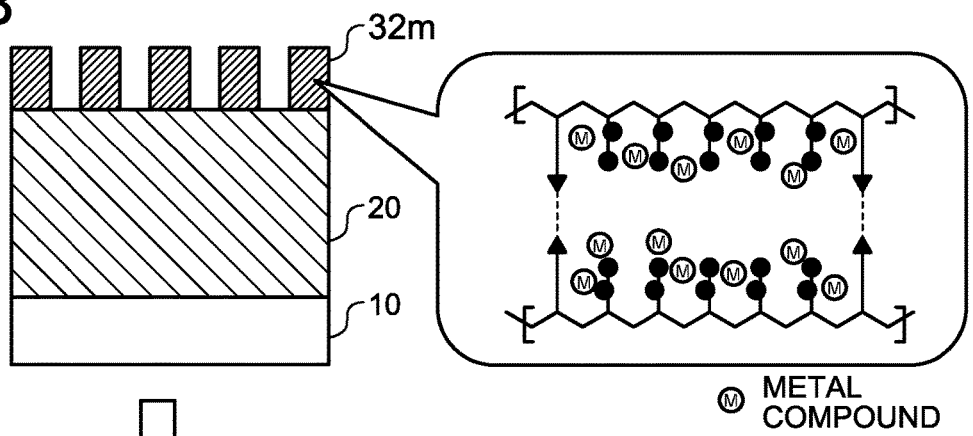

Next, according to exposure of the mask pattern 32p to water vapor atmosphere As illustrated in FIG. 12B, the precursor in the mask pattern 32p is subjected to an oxidation treatment. Accordingly, the metal included in the precursor molecule is deposited, as a metal compound like aluminum compound, in a polymer. According to the above, the polymer constituting the mask pattern 32p is metallized to yield the mask pattern 32m.

Figure 12C:
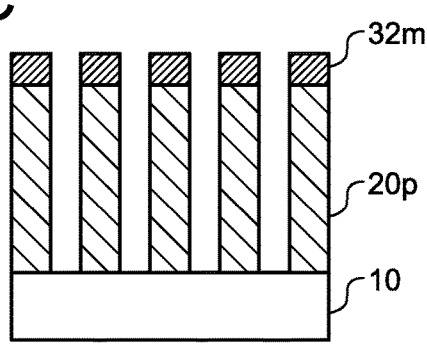

Next, As illustrated in FIG. 12C, the to-be-processed film 20 is etched using the mask pattern 32m as a mask to form patterned to-be-processed film 20p. Accordingly, the to-be-processed film 20p provided with processed profile with high aspect ratio is formed.

After that, by using a known method, a memory cell array is formed, for example. For example, the to-be-processed film 20 is employed as a stacked film of an insulating film and a conductive film, and, according to the above treatment, a hole pattern is formed on the stacked film. By embedding a block layer, a charge accumulating layer, a tunnel layer, a channel layer, and a core layer inside the hole, a memory structure can be formed. The conductive film in stacked film may be allowed to function as a word line.

According to the pattern forming material of an embodiment, as it is provided with the first monomer unit 100 having a carbonyl group, the polymer can be readily metallized. Furthermore, as the first monomer unit 100 has plural carbonyl groups which become a metal coordination site, the metal compound can be deposited at high density in a polymer. Accordingly, the mask pattern 32m with high etching resistance can be obtained, and thus it becomes possible to achieve a processing profile with high aspect ratio.

According to the pattern forming material of an embodiment, the second carbonyl group 132 present at the side chain terminal of the first monomer unit 100 binds to a linear chain part of the ester skeleton 120. Considering that adsorption of a precursor molecule to another carbonyl group may progress by taking advantage of the adsorption of a precursor molecule onto the second carbonyl group 132 at the terminal, presence of the second carbonyl group 132 at the terminal on a linear chain having less steric hindrance is suitable for the metallization. Accordingly, the precursor molecule can be adsorbed onto even more carbonyl groups, and thus the metallization of the polymer can be promoted.

According to the pattern forming material of an embodiment, as it is provided with the second monomer unit 200 which has a crosslinkable functional group at the side chain terminal, with crosslinking between polymers, it is possible to inhibit the dissolution to an organic solvent. Accordingly, an upper layer film like functional film can be formed by application or dropwise addition of a solution on top of the mask film 32. Thus, mixing between the mask film 32 and an upper layer film can be inhibited. As for the upper layer film, there are a SOC (Spin On Carbon) film, a TEOS (tetraethyl orthosilicate) film, a resist film, or the like other than the aforementioned SOG film, and design of a stacked mask structure is dramatically increased.

According to the pattern forming material of an embodiment, the mask film 32 can be formed by a method like spin coating, dipping, and vapor deposition. Since a carbon-deposited film using CVD method requires a long time for forming a film, according to the pattern forming material of an embodiment, the mask film 32 having high etching resistance can be conveniently formed within a short time.

Furthermore, although a monomer unit having an ester skeleton in a side chain is exemplified as the first monomer unit 100 in the aforementioned embodiment, it is not limited to such a case. It is also possible to apply, as a first monomer unit, a monomer unit having an ester skeleton in a main chain. In such case, plural ester skeletons that are continuously bonded to one another constitute the main chain of a polymer.

Furthermore, although the mask pattern 32p is metallized in vapor phase in the aforementioned embodiment, it is not limited to such a case. The mask pattern 32p can be also metallized in a liquid phase.

Furthermore, although a structure mainly having the mask film 32, the SOG film 40, and the resist pattern 50p is illustrated as a stacked mask structure in the aforementioned embodiment, it is not limited to such a case. For the stacked mask structure, various constitutions can be employed by inserting various films other than those described above or deleting several kinds of the above films.

Furthermore, although the mask pattern 32m is formed on top of the semiconductor substrate 10 in the aforementioned embodiment, it is not limited to such a case. The mask pattern may be formed on, other than a semiconductor substrate like silicon, a substrate like glass, quartz, and mica.

EXAMPLES

Next, the examples are described.

Example 1

Ratio of a monomer unit having a crosslinkable functional group in a polymer, and solubility and metallization characteristics of the polymer were examined.

A polymer was synthesized having various ratios of a crosslinkable monomer unit. A solution in which the synthesized polymer is dissolved in cyclohexanone or propylene glycol monomethyl ether acetate (PGMEA) was spin-coated to form a film on a silicon substrate followed by curing by heating. The thin film formed on a silicon substrate was rinsed with cyclohexanone or PGMEA, and the film thickness before and after the rinsing was measured by an atomic force microscope (AFM).

Figure 13:
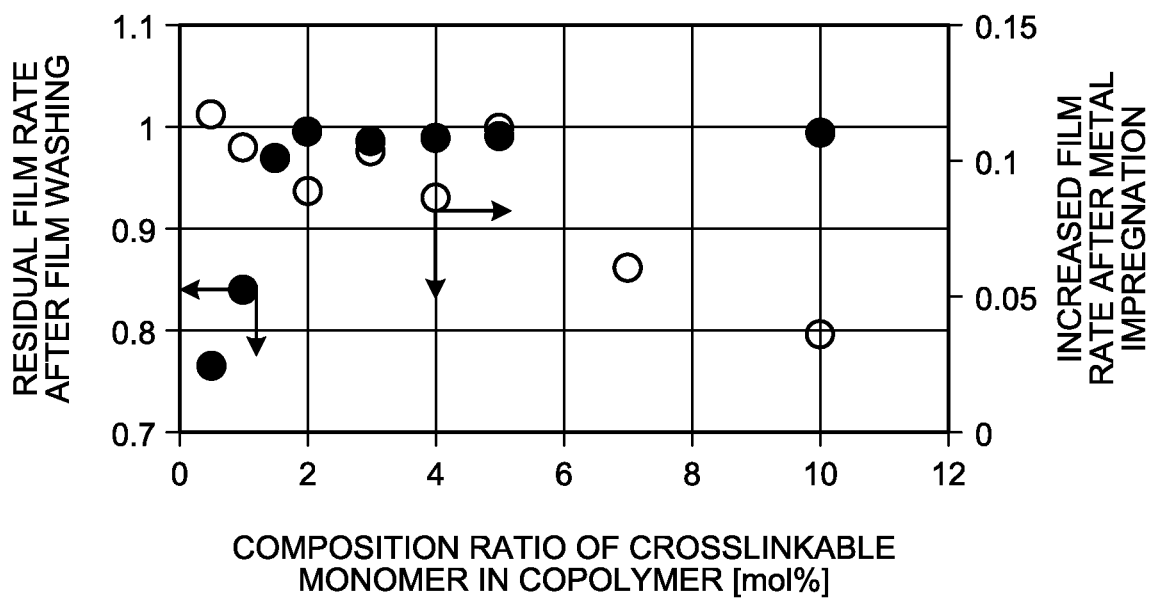
FIG. 13 is a graph illustrating the abundance ratio of the monomer unit having a crosslinkable functional group according to Example 1 in the polymer, and the solubility in an organic solvent and metallization characteristics of the polymer.

Results of the examination are illustrated in the graph of FIG. 13. The horizontal axis of the graph of FIG. 13 represents the ratio of a crosslinkable monomer unit in the polymer and the vertical axis on the left side represents the residual film rate after the rinsing. In the graph, the results of the examination were plotted as a filled circle.

Residual film rate=Film thickness after washing/Film thickness before rinsing

According to the graph of FIG. 13, when the ratio of the crosslinkable monomer unit is less than 1% by mol, about 10% or more has been dissolved relative to the initial film thickness. When the ratio of the crosslinkable monomer unit is 1.5% by mol, less than 3% has been dissolved relative to the initial film thickness. In a region in which the ratio of the crosslinkable monomer unit is 2% by mol or more, it was found that the polymer is almost insolubilized.

Thus, it is considered that the polymer has sufficient solubility resistance to solvent when the ratio of the crosslinkable monomer unit is 2% by mol or more.

Furthermore, a thin film which has been formed on a silicon substrate was metallized as described above, and film thickness was measured before and after metallization.

Results of the examination are illustrated in the graph of FIG. 13. The horizontal axis on the right side of the graph of FIG. 13 represents the increased film rate, and, in the graph, the results of the examination were plotted as an empty circle.

Increased film rate=Increase in film thickness before and after metallization/Initial film thickness According to the graph of FIG. 13, when the ratio of the crosslinkable monomer unit is 5% by mol or less, the increased film rate appeared to be 10% or so. In a region in which the ratio of the crosslinkable monomer unit is more than 5% by mol, the increased film rate was less than 10%.

Thus, it is considered that, once the ratio of the crosslinkable monomer unit is more than 5% by mol, the crosslinking density is excessively high so that the precursor cannot infiltrate deep inside the polymer matrix, thus yielding inefficient metallization characteristics.

From the examination results that are given above, as a region in which both the resistance to solvent solubility and metallization characteristics can be simultaneously obtained, a region in which the ratio of the crosslinkable monomer unit is 2% by mol or more and 5% by mol or less is considered to be appropriate.

Example 2

By using a polymer having a suitable ratio of a crosslinkable monomer unit, resistance to solvent solubility, metallization characteristics, and etching characteristics were examined.

First, after mixing the following monomers and initiators to form 50 ml of tetrahydrofuran (THF) solution, the solution was allowed to react for 8 hours at 60° C. under nitrogen.

Polymer (A+B) 1.00 mmol

A. Among the monomers M1 to M5, one kind of a monomer in which "R" is hydrogen (H) and also one kind of a monomer in which 'R" is a methyl ($CH_3$) group, each at 0.98 mmol B. One kind of each of crosslinkable monomers GAA, GMA, 4HBAGE, 4HBMGE, 3E3OMAA, and 3E3OMMA, which have a crosslinkable functional group, each at 0.02 mmol Azobisisobutyronitrile as an initiator, 0.01 mmol After the reaction, reprecipitation in methanol was carried out, followed by drying in vacuum, to yield a target polymer.

The obtained polymer was collected in an amount of 0.1 g, dissolved in 9.9 g of PGMEA, and then added with tetraethylenepentamine as a curing agent to produce the pattern forming materials of Examples 1 to 60. Those pattern forming materials were applied by spin-coating on a silicon substrate, and, according to annealing for 10 minutes at 100° C., a thin film with thickness of 50 nm was formed.

As a result of rinsing the thin films of Samples 1 to 60 with PGMEA, it was confirmed from all of the thin films that there is no change in film thickness. It is considered that, as the crosslinkable monomer reacts with a curing agent, the thin film is insolubilized.

Thin films of Samples 1 to 60 were rinsed with PGMEA, and thereafter, the thin films were placed inside a vacuum chamber, exposed to trimethylaluminum atmosphere for 10 minutes, and then exposed to water vapor for 10 minutes. The film thickness of these thin films was measured after vacuum drying, the increase rate of the film thickness was 20% or more for all of the thin films (Table 1). It is considered that these thin films have been metallized.

TABLE 1

|  |  | M1 to M5 monomers | | | | | | | | | |
|---|---|---|---|---|---|---|---|---|---|---|---|
|  |  | M1-H | M1-Me | M2-H | M2-Me | M3-H | M3-Me | M4-H | M4-Me | M5-H | M5-Me |
| Crosslinkable monomer | GAA | 20-30% | 20-30% | 40-50% | 20-30% | 30-40% | 30-40% | 30-40% | 20-30% | 40-50% | 30-40% |
|  | GMA | 20-30% | 20-30% | 40-50% | 20-30% | 30-40% | 30-40% | 30-40% | 20-30% | 40-50% | 30-40% |
|  | 4HBAGE | 20-30% | 20-30% | 40-50% | 20-30% | 30-40% | 30-40% | 30-40% | 20-30% | 40-50% | 30-40% |
|  | 4HBMGE | 20-30% | 20-30% | 40-50% | 20-30% | 30-40% | 30-40% | 30-40% | 20-30% | 40-50% | 30-40% |
|  | 3E3OMAA | 20-30% | 20-30% | 40-50% | 20-30% | 30-40% | 30-40% | 30-40% | 20-30% | 40-50% | 30-40% |
|  | 3E3OMMA | 20-30% | 20-30% | 40-50% | 20-30% | 30-40% | 30-40% | 30-40% | 20-30% | 40-50% | 30-40% |

Several kinds of the thin film of Samples 1 to 60 were metallized, and then exposed to oxygen plasma. As a result, the thin films exhibited sufficient resistance to etching.

From the above, it was found that the thin film of Example 2 having plural side chain carbonyl groups is sufficiently metallized to have high resistance to etching. It was also found that the thin film of Example 2 has sufficient resistance to solvent solubility.

Reference Example

As a reference example of Example 2, the following examination was carried out.

Polymethyl methacrylate (PMMA) in an amount of 0.1 g was dissolved in 9.9 g of PGMEA to produce a pattern forming material of Reference example. This pattern forming material was applied by spin-coating on a silicon substrate, and, after annealing for 10 minutes on a hot plate at 100° C. in air to remove any remaining solvent, a thin film with thickness of 50 nm was formed. Part of the thin film was cut out to give a test specimen 1 while the remaining was used as a test specimen 2.

The test specimen 2 was placed inside a vacuum chamber, exposed to trimethylaluminum atmosphere for 10 minutes, and then exposed to water vapor for 10 minutes. The film thickness of the test specimen 2 is measured after vacuum drying, and it was found to be 55 nm and the increase rate of the film thickness was 10%. It is considered that the thin film has been metallized.

The thin film of the test specimen 2 was metallized, and then exposed to oxygen plasma. As a result, the thin film was partly etched away, thus yielding pores on the film.

As a result of rinsing the test specimen 1 with PGMEA, the thin film was dissolved away and removed from the silicon substrate.

From the above, it was found that PMMA, which has only one side chain carbonyl group, can be metallized but it has insufficient resistance to etching. It was also found that PMMA has insufficient resistance to solvent swelling.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A pattern forming material comprising a polymer composed of two or more kinds of monomer units including a first monomer unit and a second monomer unit,
wherein the first monomer unit in the monomer units is provided with an ester skeleton having a first carbonyl group and one or more second carbonyl groups which bind to the ester skeleton,
among the second carbonyl groups, the second carbonyl group that is farthest from a main chain of the polymer is present on a linear chain, and
wherein the second monomer unit in the monomer units is provided with a crosslinkable functional group on a side chain terminal.

2. The pattern forming material according to claim 1,
wherein the first monomer unit is at least one of acetonyl methacrylate, acetonyl acrylate, acetoacetyloxyethyl methacrylate, acetoacetyloxyethyl acrylate, acetylacrylic acid anhydride, acetylmethacrylic acid anhydride, 2-acetoacetyl methacrylate, 2-acetoacetyl acrylate, 2,4-dioxopentyl methacrylate, and 2,4-dioxopentyl acrylate, and
the second monomer unit is at least one of glycidyl acrylate, glycidyl methacrylate, 4-hydroxybutyl acrylate glycidyl ether, 4-hydroxybutyl methacrylate glycidyl ether, (3-ethyl-3-oxetanyl)methyl acrylate, and (3-ethyl-3-oxetanyl)methyl methacrylate.

3. The pattern forming material according to claim 2,
wherein the monomer units contain a third monomer unit, and
the third monomer unit is at least one of styrene, hydroxystyrene, methyl (meth)acrylate, ethyl (meth)acrylate, and hydroxyethyl (meth)acrylate.

4. The pattern forming material according to claim 1,
wherein at least one of 1-butanol, N.N-dimethyl formamide, N-methyl pyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-normal-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-normal-butyl ether, propylene glycol monomethyl ether, propylene glycol monomethyl ether acetate, methyl ethyl ketone, methylcyclohexanol, methylcyclohexanone, methyl-normal-butyl ketone, isobutyl acetate, isopropyl acetate, isopentyl acetate, ethyl acetate, normal-butyl acetate, normal-propyl acetate, and normal-pentyl acetate is used as a solvent.

5. The pattern forming material according to claim 1,
wherein the first monomer unit can adsorb onto a precursor having a metal atom, and
the precursor is at least one of $AlCl_3$, $TiCl_4$, $WCl_6$, $VCl_4$, $HfCl_4$, $ZrCl_4$, and trimethylaluminum (TMA).

6. The pattern forming material according to claim 1 being used as a mask pattern for transferring a pattern to a to-be-processed film on a semiconductor substrate.

7. A pattern forming method comprising:
forming a film composed of a pattern forming material on a semiconductor substrate; and
forming a mask pattern by patterning the film,
wherein the pattern forming material containing a polymer composed of two or more kinds of monomer units including a first monomer unit and a second monomer unit,
the first monomer unit in the monomer units being provided with an ester skeleton having a first carbonyl group and one or more second carbonyl groups which bind to the ester skeleton, and
among the second carbonyl groups, the second carbonyl group that is farthest from a main chain of the polymer constituting the pattern forming material is present on a linear chain, and
the second monomer unit in the monomer units being provided with a crosslinkable functional group on a side chain terminal.

8. The pattern forming method according to claim 7, wherein, when forming the mask pattern, the mask pattern is exposed to metal-containing fluid after patterning the film, and the mask pattern is treated with an oxidizing agent.

9. The pattern forming method according to claim 7, wherein, when forming the film, another film is formed by spin coating on the film composed of the pattern forming material.

10. The pattern forming method according to claim 7,
wherein the first monomer unit is at least one of acetonyl methacrylate, acetonyl acrylate, acetoacetyloxyethyl methacrylate, acetoacetyloxyethyl acrylate, acetylacrylic acid anhydride, acetylmethacrylic acid anhydride, 2-acetoacetyl methacrylate, 2-acetoacetyl acrylate, 2,4-dioxopentyl methacrylate, and 2,4-dioxopentyl acrylate, and
the second monomer unit is at least one of glycidyl acrylate, glycidyl methacrylate, 4-hydroxybutyl acrylate glycidyl ether, 4-hydroxybutyl methacrylate glycidyl ether, (3-ethyl-3-oxetanyl)methyl acrylate, and (3-ethyl-3-oxetanyl)methyl methacrylate.

11. The pattern forming method according to claim 10,
wherein the monomer units contain a third monomer unit, and
the third monomer unit is at least one of styrene, hydroxystyrene, methyl (meth)acrylate, ethyl (meth)acrylate, and hydroxyethyl (meth)acrylate.

12. The pattern forming method according to claim 7, wherein at least one of 1-butanol, N.N-dimethyl formamide, N-methyl pyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-normal-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-normal-butyl ether, propylene glycol monomethyl ether, propylene glycol monomethyl ether acetate, methyl ethyl ketone, methylcyclohexanol, methylcyclohexanone, methyl-normal-butyl ketone, isobutyl acetate, isopropyl acetate, isopentyl acetate, ethyl acetate, normal-butyl acetate, normal-propyl acetate, and normal-pentyl acetate is used as a solvent.

13. The pattern forming method according to claim 8,
wherein the metal-containing fluid contains a precursor, and
the precursor is at least one of $AlCl_3$, $TiCl_4$, $WCl_6$, $VCl_4$, $HfCl_4$, $ZrCl_4$, and trimethylaluminum (TMA).

14. A method for manufacturing a semiconductor device comprising:
forming a film composed of a pattern forming material on a semiconductor substrate; and
forming a mask pattern by patterning the film,
wherein the pattern forming material containing a polymer composed of two or more kinds of monomer units including a first monomer unit and a second monomer unit,
the first monomer unit in the monomer units being provided with an ester skeleton having a first carbonyl group and one or more second carbonyl groups which bind to the ester skeleton, and
among the second carbonyl groups, the second carbonyl group that is farthest from a main chain of the polymer constituting the pattern forming material is present on a linear chain, and
the second monomer unit in the monomer units being provided with a crosslinkable functional group on a side chain terminal.

15. The method for manufacturing a semiconductor device according to claim 14, wherein, when forming the mask pattern, the mask pattern is exposed to metal-containing fluid after patterning the film, and the mask pattern is treated with an oxidizing agent.

16. The method for manufacturing a semiconductor device according to claim 14, wherein, when forming the film, another film is formed by spin coating on the film composed of the pattern forming material.

17. The method for manufacturing a semiconductor device according to claim 14,
wherein the first monomer unit is at least one of acetonyl methacrylate, acetonyl acrylate, acetoacetyloxyethyl methacrylate, acetoacetyloxyethyl acrylate, acetylacrylic acid anhydride, acetylmethacrylic acid anhydride, 2-acetoacetyl methacrylate, 2-acetoacetyl acrylate, 2,4-dioxopentyl methacrylate, and 2,4-dioxopentyl acrylate, and
the second monomer unit is at least one of glycidyl acrylate, glycidyl methacrylate, 4-hydroxybutyl acrylate glycidyl ether, 4-hydroxybutyl methacrylate glycidyl ether, (3-ethyl-3-oxetanyl)methyl acrylate, and (3-ethyl-3-oxetanyl)methyl methacrylate.

18. The method for manufacturing a semiconductor device according to claim 17,
wherein the monomer units contain a third monomer unit, and
the third monomer unit is at least one of styrene, hydroxystyrene, methyl (meth)acrylate, ethyl (meth)acrylate, and hydroxyethyl (meth)acrylate.

19. The method for manufacturing a semiconductor device according to claim 14, wherein at least one of 1-butanol, N.N-dimethyl formamide, N-methyl pyrrolidone, γ-butyrolactone, acetone, anisole, isobutyl alcohol, isopropyl alcohol, isopentyl alcohol, ethylene glycol monoethyl ether, ethylene glycol monoethyl ether acetate, ethylene glycol mono-normal-butyl ether, ethylene glycol monomethyl ether, ethylene glycol monomethyl ether acetate, xylene, cresol, cyclohexanol, cyclohexanone, tetrahydrofuran, toluene, ethyl lactate, propylene glycol monoethyl ether, propylene glycol monoethyl ether acetate, propylene glycol mono-normal-butyl ether, propylene glycol monomethyl ether, propylene glycol monomethyl ether acetate, methyl ethyl ketone, methylcyclohexanol, methylcyclohexanone, methyl-normal-butyl ketone, isobutyl acetate, isopropyl acetate, isopentyl acetate, ethyl acetate, normal-butyl acetate, normal-propyl acetate, and normal-pentyl acetate is used as a solvent.

20. The method for manufacturing a semiconductor device according to claim 15,
   wherein the metal-containing fluid contains a precursor, and
   the precursor is at least one of $AlCl_3$, $TiCl_4$, $WCl_6$, $VCl_4$, $HfCl_4$, $ZrCl_4$, and trimethylaluminum (TMA).

* * * * *